United States Patent
Yu et al.

(10) Patent No.: US 7,265,422 B2
(45) Date of Patent: Sep. 4, 2007

(54) LOW VOLTAGE TRIGGER AND SAVE AREA ELECTROSTATIC DISCHARGE DEVICE

(75) Inventors: Talee Yu, Shanghai (CN); Chi Kang Liu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 39 days.

(21) Appl. No.: 11/215,492

(22) Filed: Aug. 29, 2005

(65) Prior Publication Data

US 2007/0048944 A1    Mar. 1, 2007

(30) Foreign Application Priority Data

Aug. 24, 2005    (CN) .................... 2005 1 0029193

(51) Int. Cl.
*H01L 23/62* (2006.01)

(52) U.S. Cl. ............. 257/355; 257/356; 257/E29.331

(58) Field of Classification Search ........ 257/355–357, 257/134 E, 29.331–29.337, E21.356, E21.357
See application file for complete search history.

(56) References Cited

U.S. PATENT DOCUMENTS

2005/0275065 A1* 12/2005 Cogan et al. ............... 257/603

* cited by examiner

*Primary Examiner*—H. Jey Tsai
(74) *Attorney, Agent, or Firm*—Townsend and Townsend and Crew LLP

(57) ABSTRACT

Techniques for ESD protection are provided. An ESD protection device includes a first well region and a second well region disposed in a semiconductor substrate, with an isolation region therebetween. N+ implant regions are disposed in the second well region and are coupled in common at a first node. NLDD regions are disposed between the N+ implant regions, and pocket implants underlie each of the NLDD regions. Current discharge paths are defined by corresponding NLDD regions and pocket implants when a voltage of the first node exceeds a breakdown voltage. In a specific embodiment, the breakdown voltage is less than a breakdown voltage for a logic gate oxide.

20 Claims, 2 Drawing Sheets

LOW VOLTAGE TRIGGER AND SAVE AREA ELECTROSTATIC DISCHARGE DEVICE

BACKGROUND OF THE INVENTION

The present invention is directed to integrated circuits and their processing for the manufacture of semiconductor devices. More particularly, the invention provides methods and structures for electrostatic discharge (ESD) protection. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

For example, as device size becomes smaller, devices are typically more susceptible to harmful electrostatic discharges. Thus, conventional ESD protection circuits are employed to divert power surges away from susceptible devices to ground. However, gate-oxide failures due to ESD surges remain a significant risk for sub-0.25 micron devices, and more particularly sub-0.13 micron devices. In these smaller devices, the gate oxide breakdown voltage is generally lower than the typical trigger voltage of at least 6 volts in conventional ESD protection devices. The result is increased device failures. These and other limitations may be found throughout the present specification and more particularly below.

From the above, it is seen that an improved technique for ESD protection is desired.

BRIEF SUMMARY OF THE INVENTION

According to the present invention, techniques directed to integrated circuits are provided. More particularly, the invention provides an ESD protection device. Merely by way of example, the invention has been applied to advanced integrated circuits. But it would be recognized that the invention has a much broader range of applicability.

In a specific embodiment, the invention provides an electrostatic discharge (ESD) protection device. The device includes a semiconductor substrate. A first well region and a second well region are disposed in the semiconductor substrate with an isolation region therebetween. A plurality of N+ implant regions is disposed in the second well region. Each N+ implant region of the plurality of N+ implant regions are disposed away from an adjacent N+ implant region by about a predetermined length. The plurality of N+ implant regions are coupled in common. A plurality of NLDD regions, each extending about the predetermined length, are disposed between the plurality of N+ implant regions. A plurality of pocket implants, each extending about the predetermined length, underlie the plurality of NLDD regions. A plurality of salicide block regions are disposed above the plurality of NLDD regions and extend by about the predetermined length. The breakdown voltage of the ESD protection device is less than about 3.5 volts.

In another embodiment, the present invention provides an integrated circuit device including a substrate, an NMOS device, and an ESD protection device. The NMOS device includes a gate metal layer and an oxide layer underlying the gate metal layer. In a specific embodiment, a thickness of the oxide layer is less than about 20 Angstroms. The ESD protection device includes a first well region and a second well region in the semiconductor substrate. An isolation region is disposed between the first well region and the second well region. A plurality of N+ implant regions are disposed in the second well region. Each N+ implant region of the plurality of N+ implant regions is disposed away from an adjacent N+ implant region by about a length. The plurality of N+ implant regions are coupled in common. A plurality of NLDD regions, each extending by about the length, are disposed between the plurality of N+ implant regions. A plurality of pocket implants extending by about the length underlie the plurality of NLDD regions. A plurality of salicide block regions are disposed above the plurality of NLDD regions and extend by about the length. A breakdown voltage of the ESD protection device is less than a breakdown voltage of the oxide layer of the NMOS device.

Many benefits are achieved by way of the present invention over conventional techniques. For example, the present technique provides integrated circuits that have low voltage ESD protection. Additionally, the techniques for ESD protection are compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits are provided. More particularly, the invention provides a device for ESD protection. Merely by way of example, the invention has been applied to advanced integrated circuits. But it would be recognized that the invention has a much broader range of applicability.

Figure 1:
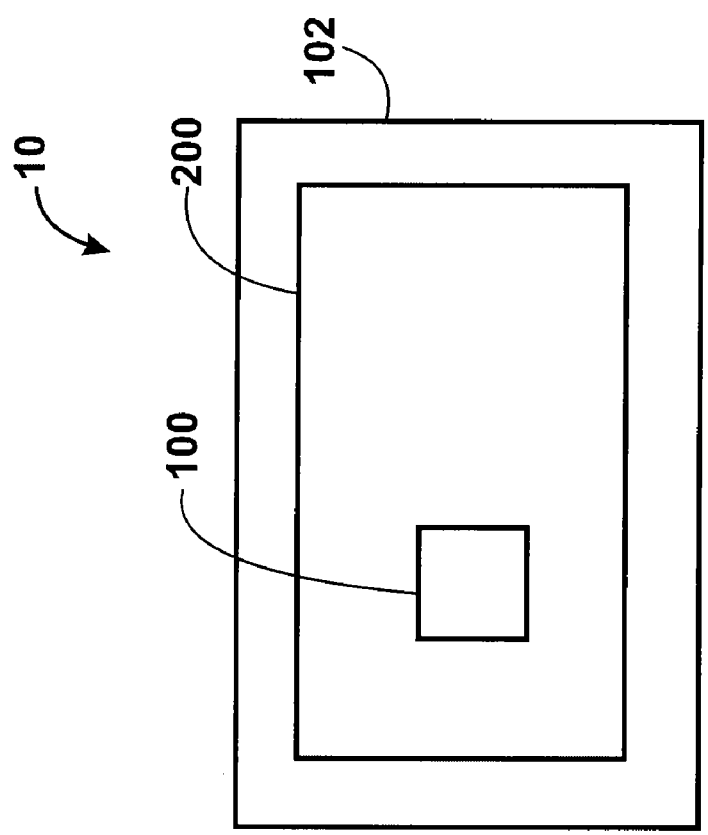
FIG. 1 is a simplified diagram illustrating an integrated circuit according to an embodiment of the present invention.

FIG. 1 is a simplified diagram illustrating an integrated circuit 10 according to an embodiment of the present invention. This diagram is merely an example, which should not unduly limit the scope of the claims herein. One of ordinary skill in the art would recognize many variations, alternatives, and modifications. As shown, integrated circuit 10 includes a ESD protection device 100 (or ESD protection circuit) and an active area 200 on substrate 102. In one embodiment, the substrate 102 is a semiconductor substrate, or more preferably a silicon substrate. Substrate 102 can be a bulk wafer or a silicon on insulator (SOI) substrate. Active area 200 contains at least one MOS transistor (for example an NMOS transistor). The at least one MOS transistor includes a gate metal layer and an oxide layer underlying the gate metal layer. In a specific embodiment, the at least one MOS transistor is manufactured with a 0.13 micron design rule, or smaller. ESD protection device 100 is used to protect the at least one MOS transistor, which can be damaged by a power surge through its gate metal layer (or gate electrode).

Accordingly, ESD protection device 100 is configured to have a trigger voltage less than the gate oxide breakdown voltage of the at least one MOS transistor. In a specific embodiment, the at least one MOS transistor has a gate oxide layer with thickness of about 20 Angstroms or less. In such instance, the gate oxide breakdown voltage can be less than about 3.5 volts. In an embodiment of the present invention, ESD protection device 100 is configured to have a trigger voltage of less than about 3.5 volts, and preferably less than 3.25 volts.

Although FIG. 1 depicts ESD protection device 100 as being within active area 200, one of ordinary skill in the art will recognize, based on the teachings herein, that ESD protection device 100 can be located anywhere on substrate 102 (i.e., within, abutting, and/or outside active area 200). In alternative embodiments of the present invention, integrated circuit 100 can include a plurality of ESD protection devices. Furthermore, each of the plurality of ESD protection devices can be configured to have different trigger voltages. In addition, each of the plurality of ESD protection devices can either be located together or distributed on the substrate.

Figure 2:
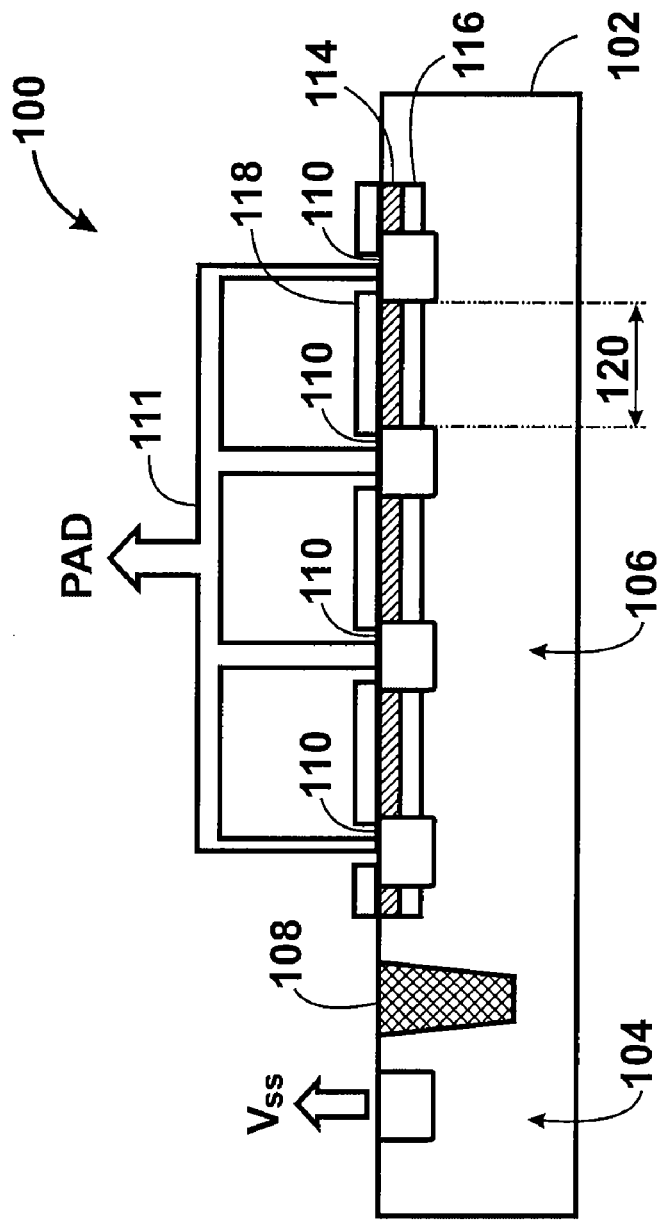
FIG. 2 is a simplified cross-section of an ESD protection device according to an embodiment of the present invention.

FIG. 2 is a simplified diagram illustrating ESD protection device 100 according to an embodiment of the present invention. This diagram is merely an example, which should not unduly limit the scope of the claims herein. One of ordinary skill in the art would recognize many variations, alternatives, and modifications. As shown in FIG. 2, ESD protection device 100 includes a first well region 104 and a second well region 106 in the semiconductor substrate 102. In an embodiment, first well region 104 is doped to have P+ type conductivity and second well region 106 is doped to have P type conductivity. The first well region 104 and second well region 106 can be formed with ion implantation processes and/or diffusion processes. The p-type dopant can be boron.

An isolation region 108 separates the first well region 104 and the second well region 106. In one embodiment, isolation region 108 is a shallow trench isolation (STI) region. Isolation region 108 can include silicon oxide, silicon dioxide, or other insulating materials. Isolation region 108 can have any arbitrary shape (i.e., a rectangle, tapered polygon, or the like), so long as it isolates the first well region 104 from the second well region 106. It should also be noted that one or more isolation regions can also be disposed between ESD protection device 100 and the at least one MOS transistor in active area 200.

A plurality of N+ implant regions 110, disposed in the second well region, are spaced a predetermined length 120 apart. Length 120 can range from about 0.2 microns to about 100 microns. The N+ implant regions 110 can be formed with ion implantation processes and/or diffusion processes. An N type dopant, such as phosphorous, arsenic, or antimony can be used. In one embodiment, arsenic can be implanted at a dose concentration of about $60 \times 10^{15}$ cm$^{-2}$ or less with implant energy of about 30 KeV to 50 KeV, preferably 40 KeV. The N+ implant regions are electrically coupled in common at a first node 111. Thus, each of the N+ implant regions have the same voltage potential. When this voltage exceeds a predetermined breakdown voltage, current will be distributed through a plurality of discharge paths.

N type lightly doped regions 114, sometimes referred to herein as NLDD regions, are disposed between N+ implant regions 110, as well as beyond the outermost N+ implant regions 110 as illustrated in FIG. 2. In an embodiment of the present invention, NLDD regions 114 extend the entire length between N+ implant regions 110, or a length 120. The NLDD regions 114 can be formed with ion implantation processes and/or diffusion processes. An N type dopant, such as phosphorous, arsenic, or antimony can be used. In one embodiment, arsenic can be implanted at a dose concentration of about $7.0 \times 10^{14}$ cm$^{-2}$ to about $1.3 \times 10^{15}$ cm$^{-2}$ with implant energy of about 2 KeV to about 3 KeV.

A plurality of pocket implants 116 underlie NLDD regions 114. In an embodiment of the present invention, pocket implants 116 extend the entire length between N+ implant regions 110, or the length 120. The pocket implants 116 can be formed with ion implantation processes and/or diffusion processes. A P type dopant, such as boron can be used. In one embodiment, boron can be implanted at a dose concentration of about $4 \times 10^{13}$ cm$^{-2}$ to $25 \times 10^{13}$ cm$^{-2}$ with implant energy of about 100 KeV to about 130 KeV. In addition, silicide block regions 118 can be formed over NLDD regions 114 for a specific embodiment. In this way, silicide can be formed at contact terminals with N+ implant regions 110 to reduce resistivity while avoiding silicide formation on NLDD regions 114.

Although a number of specific embodiments are shown and described above, embodiments of the invention are not limited thereto. For example, it is understood that the doping polarities of the structures shown and described could be reversed and/or the doping concentrations of the various elements could be altered without departing from the present invention. For example, the at least one MOS transistor in active area 200 can be a NMOS transistor or a PMOS transistor.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electrostatic discharge protection device, the device comprising:
   a semiconductor substrate;
   a first well region and a second well region in the semiconductor substrate;
   an isolation region disposed between the first well region and the second well region;

a plurality of N+ implant regions disposed in the second well region, the plurality of N+ implant regions being electrically coupled in common at a first node;

a plurality of NLDD regions each extending between two N+ implant regions of the plurality of N+ implant regions;

a plurality of pocket implants underlying corresponding NLDD regions;

a plurality of salicide block regions disposed above corresponding NLDD regions; and a plurality of current discharge paths each defined by corresponding NLDD regions and pocket implants when a voltage of the first node exceeds a predetermined breakdown voltage, wherein the breakdown voltage is less than about 3.5 volts.

2. The device of claim 1 wherein the plurality of N+ implant regions ranges includes at least two N+ implant regions.

3. The device of claim 1 wherein the plurality of N+ implant regions ranges includes at least five N+ implant regions.

4. The device of claim 1 wherein the isolation regions are shallow trench isolation regions.

5. The device of claim 1 wherein the breakdown voltage is less than 3.25 volts.

6. The device of claim 1 wherein the plurality of NLDD regions are implanted with arsenic at a dose of about $7.0 \times 10^{14}$ cm$^{-2}$ to about $1.3 \times 10^{15}$ cm$^{-2}$ and implant energy of about 2 KeV to about 3 KeV.

7. The device of claim 1 wherein the plurality of pocket implants are implanted with boron at a dose of about $4 \times 10^{13}$ cm$^{-2}$ to $25 \times 10^{13}$ cm$^{-2}$ and implant energy of about 100 KeV to about 130 KeV.

8. The device of claim 1 wherein the plurality of N+ implant regions are implanted with arsenic at a dose of about $60 \times 10^{15}$ cm$^{-2}$ or less and implant energy of about 30 KeV to about 50 KeV.

9. The device of claim 1 further comprising at least an additional NLDD region extending beyond an outermost NLDD region of the plurality of NLDD regions.

10. An electrostatic discharge protection device, the device comprising:

a semiconductor substrate;

a first well region and a second well region in the semiconductor substrate;

an isolation region disposed between the first well region and the second well region;

a plurality of N+ implant regions in the second well region, the plurality of N+ implant regions being electrically coupled in common;

a predetermine length defined by about the distance between two adjacent N+ implant regions of the plurality of N+ implant regions;

a plurality of NLDD regions, each of the NLDD regions of the plurality of NLDD regions extending between two N+ implant regions of the plurality of N+ implant regions by about the predetermined length;

a plurality of pocket implants, each corresponding pocket implant of the plurality of pocket implants underlying an NLDD region of the plurality of NLDD regions and extending by about the predetermined length; and a plurality of salicide block regions, each of the salicide block regions being disposed above an NLDD region and extending by about the predetermined length; and a plurality of current discharge paths each defined by an NLDD region and a corresponding pocket implant when a breakdown voltage is exceeded, wherein the break down voltage is less than about 3.5 volts.

11. The device of claim 10 wherein the predetermined length is less than about 100 microns.

12. The device of claim 10 wherein the predetermined length ranges from about 0.2_ microns to about 100 microns.

13. An integrated circuit device comprising:

a substrate;

a NMOS device, the NMOS device comprising:

at least one gate metal layer;

an oxide layer underlying the at least one gate metal layer, a thickness of the oxide layer being less than about 20 Angstroms;

an ESD protection device; the ESD protection device comprising:

a first well region and a second well region in the substrate;

an isolation region disposed between the first well region and the second well region;

a plurality of N+ implant regions disposed in the second well region, the plurality of N+ implant regions being electrically coupled in common at a first node;

a plurality of NLDD regions each extending between two N+ implant regions of the plurality of N+ implant regions;

a plurality of pocket implants underlying corresponding NLDD regions;

a plurality of salicide block regions disposed above corresponding NLDD regions; and a plurality of current discharge paths each defined by corresponding NLDD regions and pocket implants when a voltage of the first node exceeds a breakdown voltage, wherein the break down voltage is less than about 3.5 volts.

14. The device of claim 13 wherein the plurality of N+ implant regions ranges includes at least two N+ implant regions.

15. The device of claim 13 wherein the plurality of N+ implant regions ranges includes at least five N+ implant regions.

16. The device of claim 13 wherein the isolation regions are shallow trench isolation regions.

17. The device of claim 13 wherein the breakdown voltage is less than 3.25 volts.

18. The device of claim 13 wherein the plurality of NLDD regions are implanted with arsenic at a dose of $7.0 \times 10^{14}$ cm$^{-2}$ to about $1.3 \times 10^{15}$ cm$^{-2}$ and implant energy of about 2 KeV to about 3 KeV.

19. The device of claim 13 wherein the plurality of pocket implants are implanted with boron at a dose of about $4 \times 10^{13}$ cm$^{-2}$ to $25 \times 10^{13}$ cm$^{-2}$ and implant energy of about 100 KeV to about 130 KeV.

20. The device of claim 13 wherein the plurality of implant regions are implanted with arsenic at a dose of about $60 \times 10^{15}$ cm$^{-2}$ or less and implant energy of about 30 KeV to about 50 KeV.

* * * * *